(12) United States Patent
Palin

(10) Patent No.: US 8,492,077 B2
(45) Date of Patent: Jul. 23, 2013

(54) METHOD FOR PROVIDING A CONDUCTIVE MATERIAL STRUCTURE ON A CARRIER

(75) Inventor: Ulf Palin, Ljusterö (SE)

(73) Assignee: Laird Technologies, Inc., Earth City, MO (US)

( * ) Notice: Subject to any disclaimer, the term of this patent is extended or adjusted under 35 U.S.C. 154(b) by 39 days.

(21) Appl. No.: 13/211,920

(22) Filed: Aug. 17, 2011

(65) Prior Publication Data

US 2011/0300489 A1    Dec. 8, 2011

Related U.S. Application Data

(63) Continuation-in-part of application No. PCT/SE2010/050131, filed on Feb. 4, 2010.

(30) Foreign Application Priority Data

Mar. 20, 2009 (EP) .................................... 09155698

(51) Int. Cl.
*G03F 7/26* (2006.01)

(52) U.S. Cl.
USPC ......................................................... 430/315

(58) Field of Classification Search
USPC .......................................... 430/315, 311, 319
See application file for complete search history.

(56) References Cited

U.S. PATENT DOCUMENTS

| | | | |
|---|---|---|---|
| 3,900,320 A | 8/1975 | Rolker et al. | |
| 5,066,360 A * | 11/1991 | Daley et al. | 216/13 |
| 5,112,726 A | 5/1992 | Cohen et al. | |
| 6,495,456 B1 | 12/2002 | Kanoh et al. | |
| 2009/0020315 A1 | 1/2009 | Dutton | |

FOREIGN PATENT DOCUMENTS

| | | | |
|---|---|---|---|
| CN | 87105988 | | 8/1988 |
| GB | 2080043 | | 1/1982 |
| JP | 11008447 | * | 1/1999 |
| JP | 2002-129347 | | 5/2002 |
| WO | WO 00/35259 | | 6/2000 |
| WO | WO 2010/107363 | | 9/2010 |

OTHER PUBLICATIONS

International Search Report for PCT/SE2010/050131 (published as WO 2010/107363), dated May 6, 2010; 6 pages. The instant application is a continuation-in-part of PCT/SE2010/050131 (WO 2010/107363).

European Search Report for EP Application No. 09155698.5 (published as EP 2230890); dated Jul. 3, 2009; 6 pages; The instant application is a continuation-in-part of PCT/SE2010/050131 (WO 2010/107363) which in turn claims priority to EP Application No. 09155698.6 (EP2230890).

(Continued)

*Primary Examiner* — Kathleen Duda
*Assistant Examiner* — Caleen Sullivan
(74) *Attorney, Agent, or Firm* — Harness, Dickey & Pierce, P.L.C.

(57) ABSTRACT

An exemplary method for providing a conductive material structure on a carrier generally includes applying a photo sensitive material on the carrier and applying a mask on the photo sensitive material. The mask defines a conductive material structure to be formed on the carrier. The method also includes irradiating the defined structure on the carrier in order to prepare for metallization, and metalizing the defined structure for forming the conductive material structure.

18 Claims, 5 Drawing Sheets

OTHER PUBLICATIONS

European Office Action for EP Application No. 09155698.5 (published as EP 2230890); dated Apr. 21, 2011; 1 page; The instant application is a continuation-in-part of PCT/SE2010/050131 (WO 2010/107363) which in turn claims priority to EP Application No. 09155698.6 (EP2230890).

Chinese Office action issued by the Chinese Patent Office dated Jan. 30, 2013, for Chinese Patent Application No. 201080012553.9 which is the priority application of International Patent Application No. PCT/SE2010/050131 (published as WO 2010/107363) from which the instant application is a continuation-in-part filing; 8 pgs.

* cited by examiner

METHOD FOR PROVIDING A CONDUCTIVE MATERIAL STRUCTURE ON A CARRIER

CROSS REFERENCE TO RELATED APPLICATIONS

This application is a continuation-in-part of PCT International Patent Application No. PCT/SE2010/050131 filed Feb. 4, 2010 (published as WO 2010/107363), which, in turn, claimed priority to European Patent Application No. 09155698.5 filed Mar. 20, 2009 (published as EP2230890). The entire disclosures of the above applications are incorporated herein by reference.

FIELD

The present disclosure generally relates to the provision of a conductive material structure on a carrier, such as a structure defining conductors and/or radiators.

BACKGROUND

This section provides background information related to the present disclosure which is not necessarily prior art.

Electrically conductive structures are known to be provided on carriers such as circuit boards. But there is also a need for providing such structures on flex films, chassis, covers, casings, or middle decks of a piece of electronic equipment like a cellular phone. In some cases, the structure is to function as a radiator or antenna. When it is provided as such, it is important that the structure is well defined or otherwise the radiation properties may be worse than expected.

There are some ways in which electrically conductive structures are provided on carriers, like carriers made from silicon or plastic substrates. One way in which they may be applied is through the use of Laser Direct Structuring (LDS), where a plastic material that is doped with particles of electrically conductive material, like copper, is irradiated with laser light. This laser light then causes the metal to appear on the surface of the plastic material. This allows the provision of a well defined structure. But lasers are fairly expensive equipment.

Another example is through two shot molding. In this method, molding is performed using two polymers in two molding tools, where one polymer can be metalized and the other cannot. Such tools are expensive, and it is therefore undesirable to change the structure too often. A carrier produced this way is thick, which is disadvantageous if it is to be used in a small portable electronic communications device, such as a cellular phone, where size restrictions are often severe.

SUMMARY

This section provides a general summary of the disclosure, and is not a comprehensive disclosure of its full scope or all of its features.

According to various aspects, example embodiments are disclosed for providing conductive material structures on carriers. In an example embodiment, a method generally includes applying a photo sensitive material on the carrier and applying a mask on the photo sensitive material. The mask defines a conductive material structure to be formed on the carrier. The method also includes irradiating the defined structure on the carrier in order to prepare for metallization, and metalizing the defined structure for forming the conductive material structure.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

Figure 1:
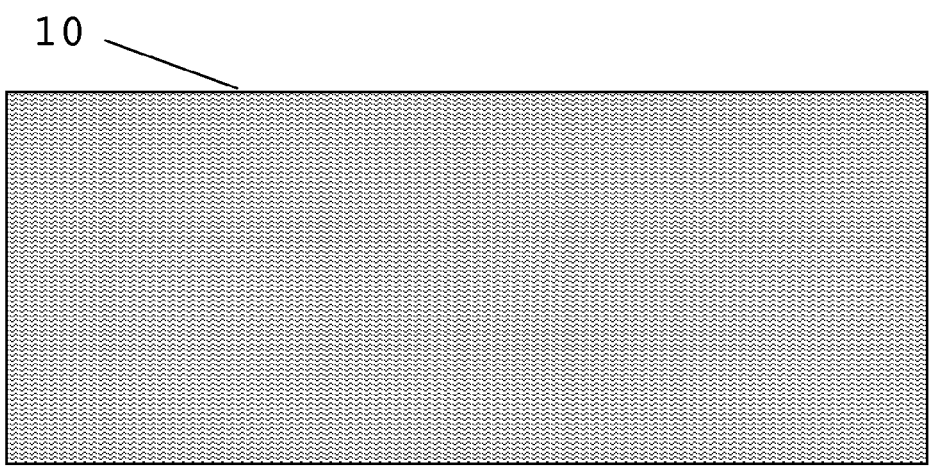
FIG. 1 shows a top view of a carrier acting as a substrate for a conductive material structure to be formed.
Figure 8:
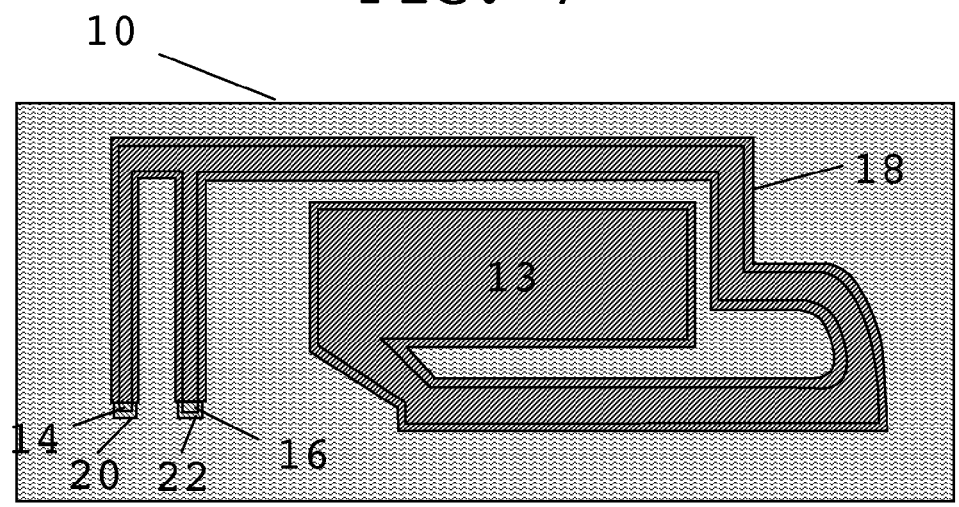
FIG. 8 shows a top view of the covered material structure, where contact areas thereof have received electrical contact enhancing material.
Figure 9:
Figure 10:
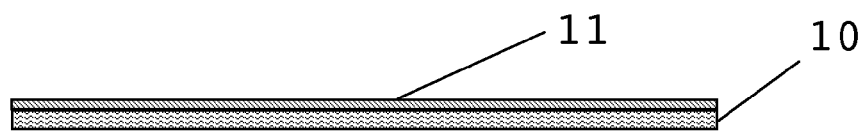
Figure 11:
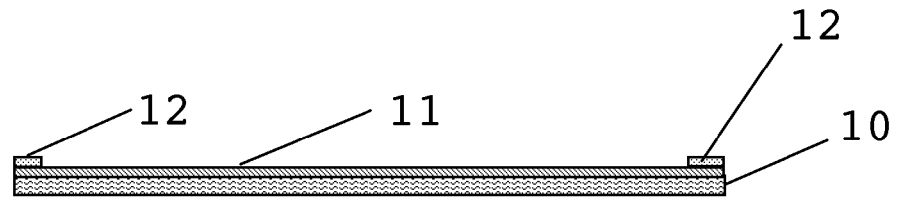
Figure 12:
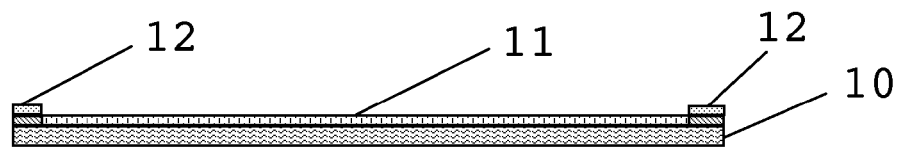
Figure 13:
Figure 14:
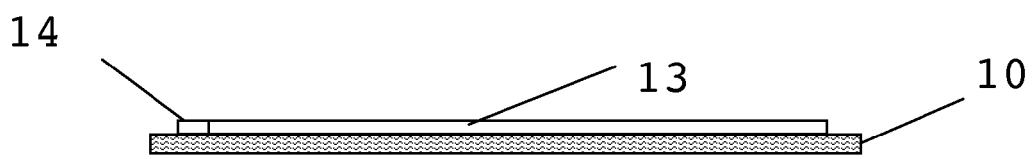
Figure 15:
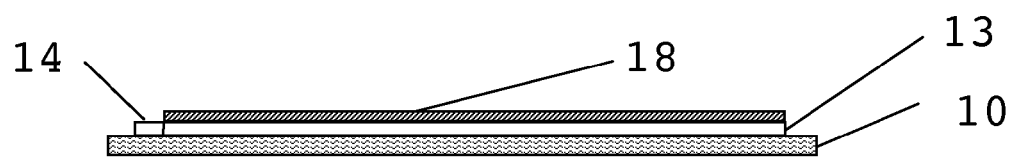
Figure 16:
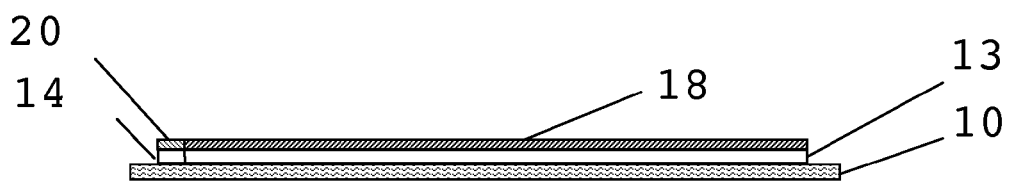
Figure 17:
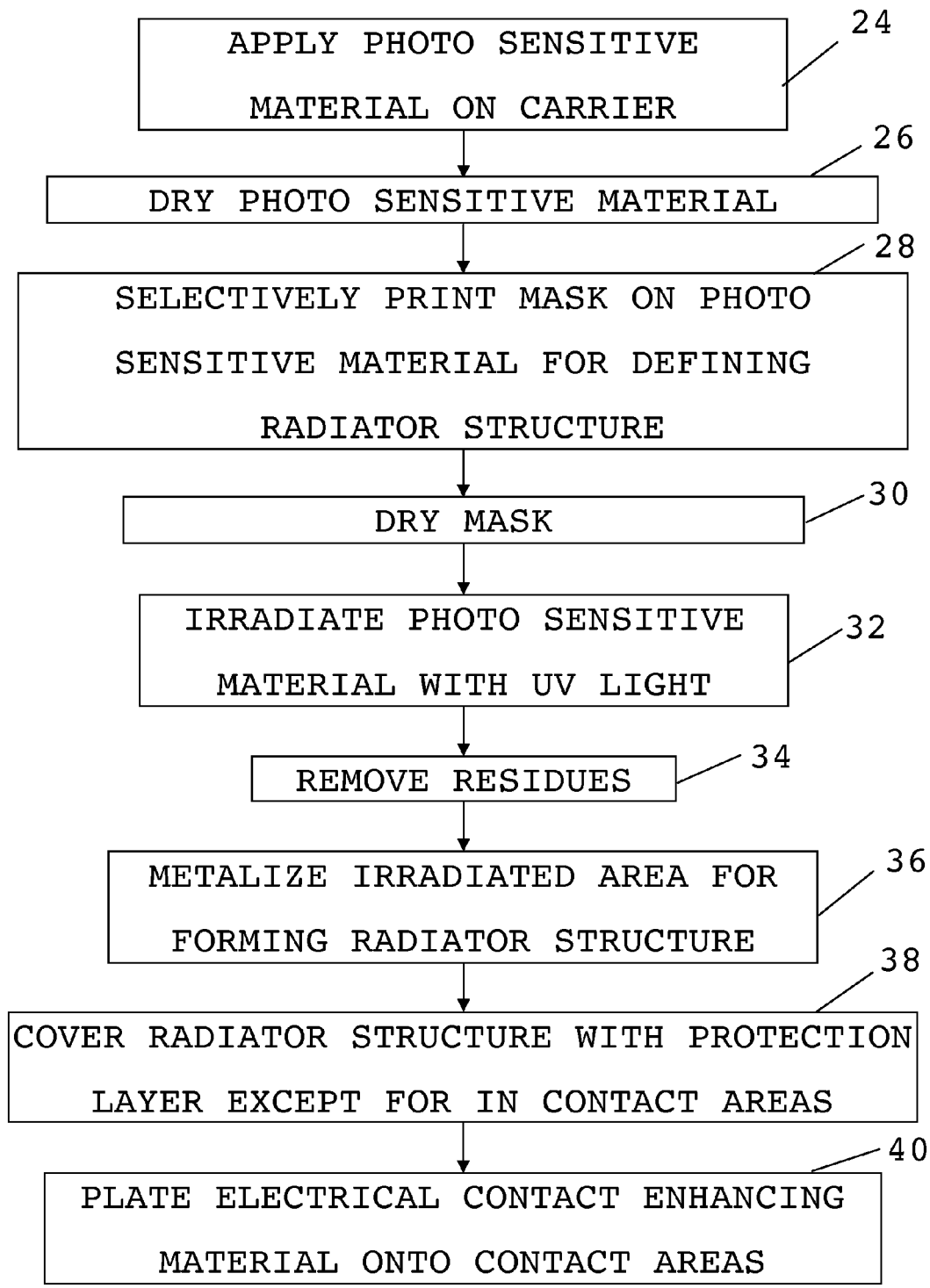

FIG. 9 shows a side view of the carrier in FIG. 1;
FIG. 10 shows a side view of the carrier in FIG. 2;
FIG. 11 shows a side view of the carrier in FIG. 3;
FIG. 12 shows a side view of the carrier in FIG. 4;
FIG. 13 shows a side view of the carrier in FIG. 5;
FIG. 14 shows a side view of the carrier in FIG. 6;
FIG. 15 shows a side view of the carrier in FIG. 7;
FIG. 16 shows a side view of the carrier in FIG. 8; and
FIG. 17 shows a flow chart of a number of method steps of a method according to an exemplary embodiment.

DETAILED DESCRIPTION

Example embodiments will now be described more fully with reference to the accompanying drawings.

The inventor hereof has recognized a need for an alternative way to provide a well defined conductive material structure on a carrier using photo sensitive material. Accordingly, the inventor has disclosed herein exemplary methods for providing an electrically-conductive material structure on a carrier using photo sensitive material, which methods can achieve well-defined conductive material structures regardless of the preciseness of light sources used. These methods are based on the inventor's realization that a mask that defines a conductive material structure can be applied on a photo sensitive material provided on the carrier. In this way, it is possible to use less precise, and hence more economical, light sources for activating the photo sensitive material in order to metalize the defined structure.

Accordingly, disclosed herein are exemplary methods for providing a conductive material structure on a carrier where the problem of achieving a well-defined conductive material structure regardless of the preciseness of the light sources used is solved through applying a photo sensitive material on the carrier, applying a mask on this photo sensitive material, where the mask defines a conductive material structure to be formed on the carrier, irradiating the defined structure on the carrier in order to prepare for metallization and metalizing the defined structure for forming the conductive material structure.

Aspects of the present disclosure are generally directed towards the provision of electrically conductive material structures on carriers where the material structures are able to conduct electrical currents. Such structures may be conductors or antenna radiator traces provided on circuit boards, flex films, chassis, covers, casings, or middle decks of a piece of electronic equipment. A piece of electronic equipment where such a carrier having an electrically conductive material structure may be provided can be such a thing as a portable electronic device, like a gaming machine or an electronic organizer. Such a portable electronic device may also be a portable communication device such as a cellular phone, a lap top computer, or a desk top computer.

A carrier with conductive material structure may be provided as a mounting entity, which is to be mounted as one piece in such a piece of electronic equipment. The conductive material structure may be provided on the exterior of this entity, like on the surface of it. This means that the carrier will become an outer surface of such a mounting entity.

Traditional ways to produce a conductive material structure on a carrier typically involve the use of precise light sources like lasers or are dependent on molding tool equipment. Both these approaches are associated with considerable costs. The use of two different polymers in two molding tools used in two shot molding also provides a relatively thick carrier, which is of disadvantage if it is to be provided inside a thin portable radio communication device such as cellular phone. But with the inventor's methods for providing a conductive material structure on a carrier, a well-defined conductive material structure may be achieved regardless of the preciseness of the light sources used.

The material structure that is to be provided on the carrier will in the following be exemplified through a radiator structure having the structure and shape of an antenna element. The exemplifying radiator structure may be in the form of a Planar Inverted-F multiband antenna (multiband PIFA). The radiator structures disclosed herein are only examples as the inventor's methods may be used to form other radiator structures. A conductive material structure may also include more than one antenna. The conductive material structure is not solely limited to antennas, but may be any conductive material structure provided on a carrier. It may for instance be the conductors and component contact points provided on a printed circuit board (PCB) or the layout of a PCB. Such a structure may be a conductive structure provided on a carrier in the form of a printed circuit board (PCB) or a flex film. In these examples, the structure may be a two-dimensional structure provided on a planar surface of a carrier.

The inventor's methods are also not limited to these types of carriers. The carrier may have a three-dimensional extension such that it may extend in three dimensions. Here, a three-dimensional conductive material structure may be provided on a curved surface of a carrier or on two planar surfaces of a carrier that are provided at an angle to each other (e.g., acute, obtuse, or right angle). Such a surface or surfaces may be the exterior or a part of the exterior of a mounting entity, like for instance a chassis.

With reference now to the figures, an exemplary embodiment of the inventor's method will now be described in more detail. FIGS. 1 through 16 show the carrier during various process steps in this exemplary method. FIG. 17 shows a flow chart outlining a number of method steps being taken in this exemplary embodiment of the present invention, when producing a conductive material structure on a carrier.

A carrier 10 is shown in a top view in FIG. 1 and in a side view in FIG. 9. The carrier 10 may be provided in the form of a dielectric substrate 10 that may be silicon based or made of a plastic material. This exemplary method starts through applying a photo sensitive material 11 on the carrier 10 (step 24 in FIG. 17). This photo sensitive material 11 may cover the whole or only a part of the carrier 10. The photo sensitive material 11 covers an area on the carrier 10 where a radiator structure is to be provided.

Figure 2:
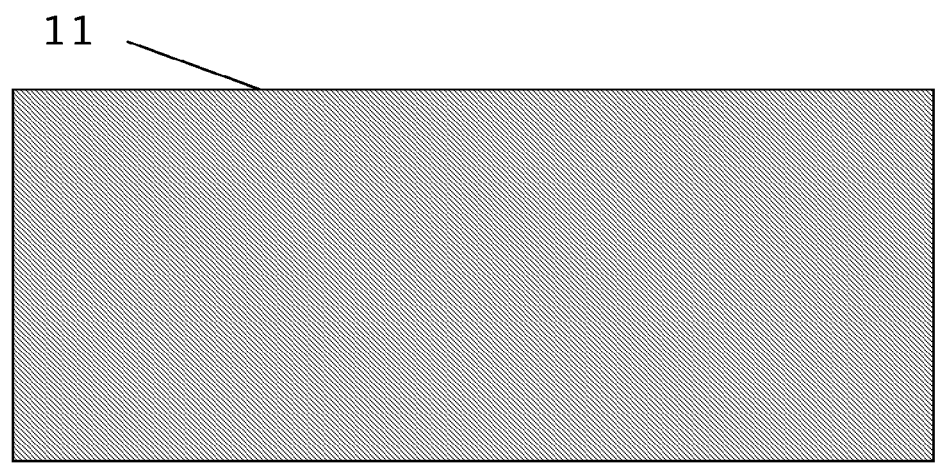
FIG. 2 shows a top view of a carrier on which a photo sensitive material layer has been printed.

In this example, the photo sensitive material layer 11 is water soluble and is applied through printing it on the carrier 10. But the photo sensitive material 11 is not limited to being soluble in water, as it may also be soluble in other liquids. For example, it may not be soluble at all in other embodiments. But the non-activated photo sensitive material is removable irrespective of the properties allowing such removal. Depending on the shape of the carrier, it may here be advantageous with screen printing or pad printing. But it is possible to apply the photo sensitive material in other ways. For example, it is possible to use spraying or dipping of the carrier in the photo sensitive material. The photo sensitive material may include a polymer and possibly also a reagent. The carrier with applied photo sensitive material 11 is schematically shown in FIGS. 2 and 10. After the photo sensitive material has been applied, it is thereafter dried (step 26 in FIG. 17). This drying step is optional depending on if later steps can be performed using moist photo sensitive material or not.

When this has been done, a mask 12 is applied on the photo sensitive material. Here it is possible that the mask is a chemical mask, for instance being sprayed over the photo sensitive material. It is also possible to use various types of printing for instance ink-jet printing, screen printing or pad printing. The printing in this example is pad printing. Alternatively, a mechanical mask may also be used.

The use of pad printing is of special interest in case the structure is to be provided on a curved carrier surface, since pad printing uses a pad that receives material according to a desired structure on a pad, which is then pressed onto a surface that can have any shape. The pad here adapts its shape to the shape of a carrier, which means that a conductive material structure may be provided on a curved carrier surface. Such a position may be of advantage in many portable electronic devices that need to be kept small. Therefore, this means that the volume in the interior of such a device, like a cellular phone, is used more efficiently. As an alternative to this, screen printing can also work, where the carrier may be turned for printing on different sides of the carrier.

In the present exemplary embodiment, a mask 12 is furthermore applied through selectively printing it on the photo sensitive material 11 (step 28 in FIG. 17), in order to define the desired radiator structure. The mask 12 may here be water soluble in order to simplify application and later removal. The mask 12 is not limited to being soluble in water, as it may also be soluble in other liquids. In some embodiment, the mask may not be soluble at all, but is still removable irrespective of the properties allowing such removal.

Figure 3:
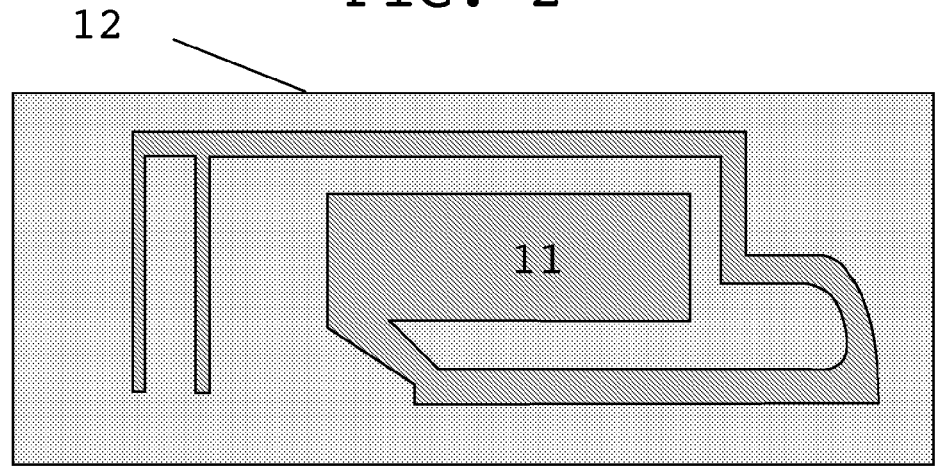
FIG. 3 shows a top view of the carrier where a mask has been printed on top of the photo sensitive material layer.

The carrier 10 with photo sensitive material 11 and mask 12 is schematically shown in FIGS. 3 and 11. In the present example embodiment, the mask 12 is applied so that the area where the radiator structure is to be provided is exposed. There is in this embodiment no mask 12 placed on the part of the carrier 10 where the actual radiator structure is to appear. The mask 12 thus has a pattern that overlaps the photo sensitive material and this pattern defines openings in the mask material, which openings in turn define the radiator structure. The mask 12 can also be seen as defining where the edges of the conductive material structure are to be provided. In this way, the mask 12 thus defines the conductive material structure that is to be formed on the carrier 10. The mask here has activating wavelength filter properties in that it filters away light at an activating wavelength of the photo sensitive material and may be made of a PVA (Poly Vinyl Alcohol) or similar material. In this embodiment, the activating wavelength lies in the UV (Ultra Violet) range. Thus, the mask has UV filter properties. Thereafter, the mask is dried (step 30 in FIG. 17). Also, this drying step 30 is optional depending on if later steps can be provided on moist or dry mask material.

In an alternative embodiment, another masking technique may be used, such as for instance to place the mask on the area that is to receive the radiator structure and then remove the photo sensitive material from the non-masked areas. This is then followed by removal of the mask for exposing the photo sensitive material. The remaining photo sensitive material is then shaped according the conductive material structure to be received.

Figure 4:
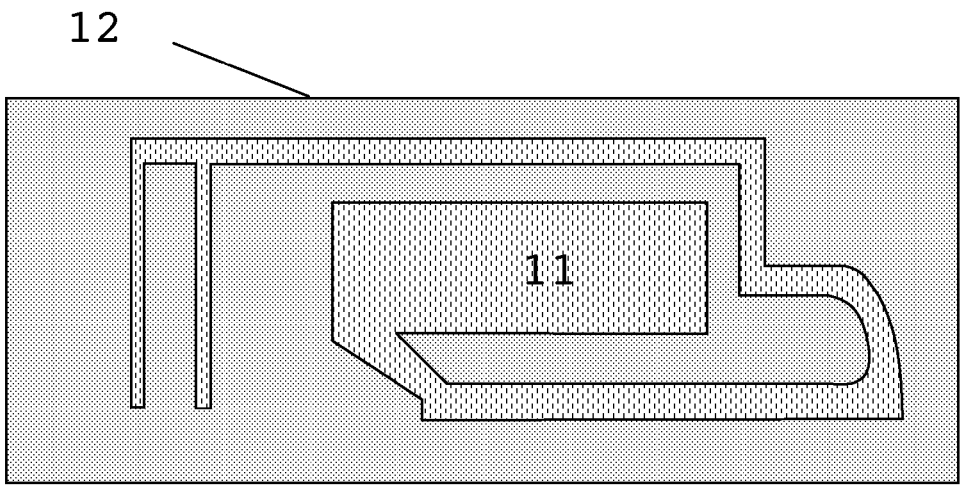
FIG. 4 shows a top view of the carrier with the mask after irradiation with UV light on exposed photo sensitive material.

When there is provided exposed photo sensitive material in a pattern shaped as the desired conductive material structure, this material is irradiated with light including the activating wavelength for being activated (step 32 in FIG. 17), which may be done using a UV lamp, a UV laser or other suitable UV source with a suitable wavelength. The wavelength may for instance be in the range of 200-1000 nanometers (nm), 500-1000 nm, or even about 266 or 355 nm. In the activation, the irradiation causes a reagent to bind the polymer of the photo sensitive material to the carrier. Such a reagent may already be a part of the photo sensitive material. Alternatively, it may be added in a reagent adding step, which may be performed at any time between the application of the photo sensitive material and the irradiation of this material. The polymer does furthermore have fiber strands on which the conductive material that is to form the structure is to attach. Activation may also need the use of an activating metal material, which may be provided in a solution, like a solution of Palladium that may be added through dipping the carrier in the solution. The activating material here assists in the attachment of the conductive material to the fiber strands. The activated state of the photo sensitive material 11 is indicated in FIGS. 4 and 12.

Figure 5:
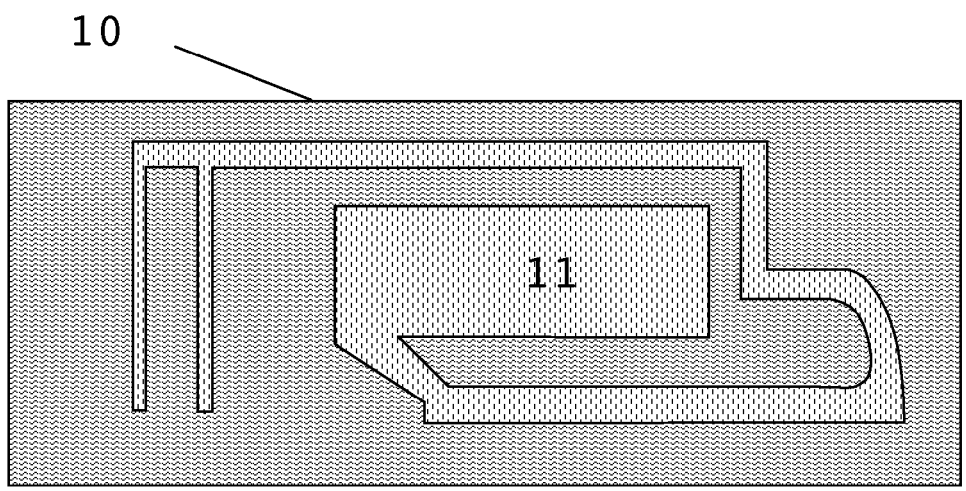
FIG. 5 shows a top view of the carrier with remaining photo sensitive material after removal of residues.

The irradiation is optionally followed by removal of residues or residual material (step 34 in FIG. 17) including removal of the mask and non-activated photo sensitive material. This may be done by rinse, mechanical brush wash, or other suitable wash technique. The carrier after such removal is shown in FIGS. 5 and 13.

Figure 6:
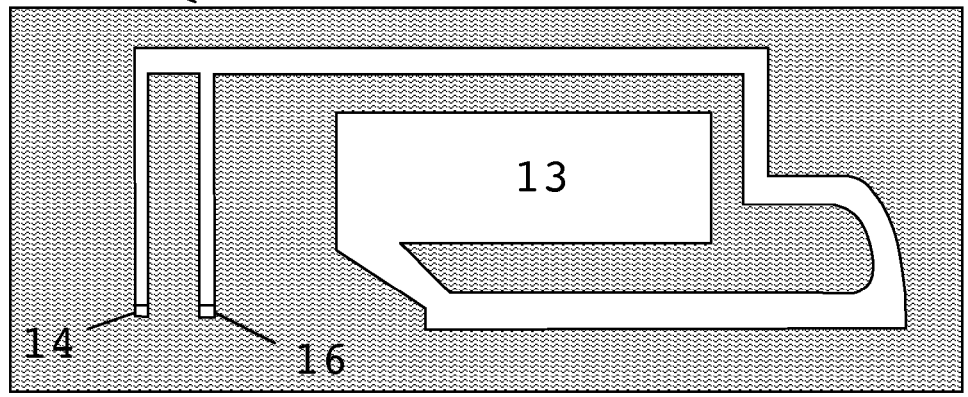
FIG. 6 shows a top view of the carrier after metallization of the remaining photo sensitive material for forming the conductive material structure.

Thereafter, the radiator structure is formed through metallization of the irradiated and activated area (step 36 in FIG. 17). The structure is thus metalized for forming the conductive material structure. Metallization may be performed through plating of a metal like copper, etc. Other possible materials are Nickel, Silver, Palladium, etc. This plating may, for example, be electroless plating or electroplating. FIGS. 6 and 14 show the thus formed radiator structure 13 on the carrier 10. Since the polymer is bound to the carrier, conductive material being applied to the fiber strands will be retained on the carrier.

The structure 13 includes at least one contact area where the structure is to be connected to another entity, such as for instance to a conductor, to a circuit, to a circuit board, to a component, etc. Since the structure according to the present example is a PIFA, two such areas 14 and 16 are provided on this structure 13. Naturally, there may be more or fewer such areas for other types of conductive material structures. In the case of PIFA, one such area 14 is a signal connection area for connection to a radio circuit, and the other area 16 is a ground connection area for connection to a ground potential. The connection to the radio circuit and to the ground potential may both be provided via a circuit board provided separately from the carrier 10.

The thus formed structure may be the final structure. But in this example, the structure is presumed to be the subject of environmental hazards such as corrosion and moisture. The conductive material structure may therefore need an environmental protection layer or an environmental protection cover that protects it from this environment, such as protecting it from air, dirt, and/or water. It may also need contact enhancing material in the above-mentioned contact areas, where such contact enhancing material may act to lower the contact resistance in connections to other entities, such as components and circuits in the electronic device. The environmental protection layer and contact enhancing material may be provided using conventional techniques and methods. The traditional way that such a protection layer and contact enhancing material are provided is through providing the whole conductive material structure with contact enhancing material and thereafter the conductive material structure is covered with a protection layer. This has the disadvantage in that an excessive amount of contact enhancing material is used. This may be very expensive, especially if the contact enhancing material used is gold.

Figure 7:
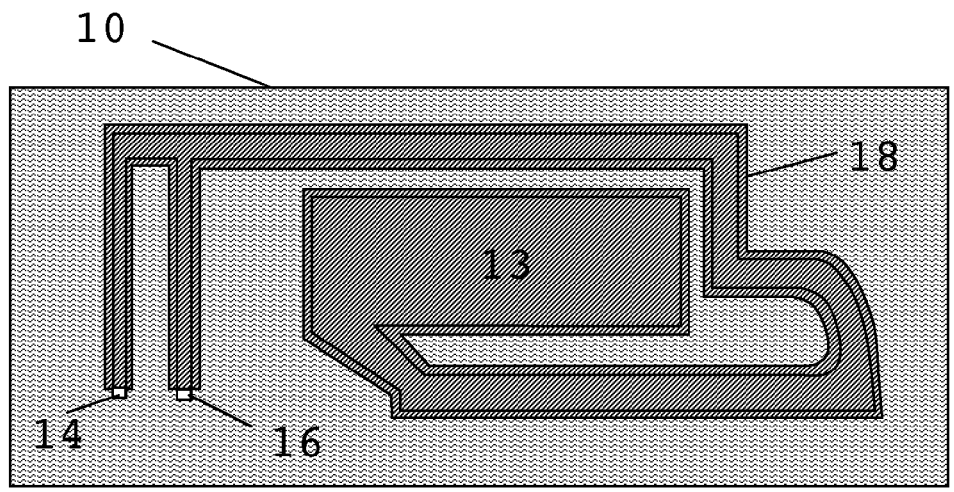
FIG. 7 shows a top view of the carrier, where the conductive material structure has been covered by a an environmental protection layer.

In order to avoid this waste, the radiator structure may according to the present invention be covered with an environmental protection layer or protective cover 18 except for in a set of areas including at least one contact area and here the two contact areas 14 and 16 (step 38 in FIG. 17). The radiator structure with protective cover is shown in FIGS. 7 and 15. This protective cover 18 is here furthermore provided onto a side of this conductive material structure 13 that faces away from the carrier 10. This means that a protective layer is provided over the parts of the structure that are to be insulated and not areas to be used for contacting other devices or for performing other activities, such as probe areas for testing. Here, it is possible that a mask of protective material may be sprayed or printed, for instance, using ink-jet printing, screen printing or pad printing.

In this embodiment, the protection layer 18 is printed over the radiator structure 13 except for in the contact areas. In this example, the printing is pad printing. The material may here be a plastic material. It may also in some cases be a metal such as gold, silver, nickel, etc. that does not corrode easily. It may also be a combination of gold and nickel. An electrically insulating material, like a plastic material, may be advantageous for cost reasons. This material may be an acrylic lacquer, polyester, etc. The mask is here selected so that it protects the underlying structure from environmental hazards such as corrosion and/or moisture. The use of plastic has another advantage as the plastic will provide electrostatic discharge (ESD) protection from other components in the device. If the structure is an antenna, the ESD influence on the antenna efficiency and the radio frequency (RF) properties will then be limited.

It is also possible to use a masking technique such as for instance to deposit the protective material over all the structure, provide a mask over the parts that are to retain the protective material, remove the protective material from the non-masked areas, and then remove the mask material.

After the structure 13 has been covered with the protective layer 18, electrical contact enhancing material 20, 22 is placed in the uncovered contact areas 14 and 16 of the structure 13 (step 40 in FIG. 17). The placing of electrical contact enhancing material is thus performed after the conductive material structure 13 has been covered with the environmental protection layer 18. The structure 13 covered by a protective layer 18 with electrical contact enhancing material 20 and 22 over contact areas 14 and 16 is schematically shown in FIGS. 8 and 16. The material may be placed in these contact areas through plating, like electroless plating or electroplating, sputtering or chemical vapor deposition, etc. In this step of placing electrical contact enhancing material, the protective layer 18 acts as a mask that stops the other parts of the structure from receiving contact enhancing material. The contact enhancing material may here be a metal such as gold, silver, nickel, tin, a combination of such metals such as a combination of gold and nickel, etc.

The disclosed methods of providing a conductive material structure allow flexibility in the design of the structure combined with simple tools for defining the radiator structure. It is for instance possible to only use a simple two-dimensional cliché for providing a mask that defines the radiator structure. Even though such a cliché is used for providing a mask, a well defined radiator structure is obtained. The light sources used for irradiating the photo sensitive material need therefore not be well focused to the area covered for obtaining a well-defined radiator structure. Neither do the light sources have to be precise regarding wavelength as long as the activating wavelength is included. The disclosed methods can therefore also be implemented using inexpensive light sources for irradiating the photo sensitive material. This is furthermore combined with enabling a provision of thin carriers and without having to compromise the exactness of the conductive material structure. Since the tools for providing a mask can be simple and inexpensive, it is easy to change design through merely exchanging one cliché for another. The disclosed methods therefore also allow the provision of more flexible production.

The cover that is used for protecting the structure in the end product that is to be mounted in an electronic device acts as a mask when providing contact enhancing material. This means that the amount of contact enhancing material used is reduced. This also means that contact enhancing material is limited to what is necessary for ensuring contact at areas of the structure where contact is desired. This is also done without using additional process steps.

The printed environmental protection layer has a further advantage in that it can be used for providing an aesthetically interesting surface on the carrier. The surface may through this printing be provided with a graphical design, such as a company logotype, a figure, or some other type of design. It can also be used for providing characters such as text and numbers and can therefore provide written and/or graphical messages.

As mentioned above, the set of areas that are to be excluded from being covered by the protective layer includes electrical contact areas for connection to other entities in the electronic equipment. However, this set may include also other areas such as probing areas that are to be used for testing the contact material structure. Such probing areas may or may not receive contact enhancing material.

Numerical dimensions and values are provided herein for illustrative purposes only. The particular dimensions and values provided are not intended to limit the scope of the present disclosure.

Spatially relative terms, such as "inner," "outer," "beneath", "below", "lower", "above", "upper" and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting. As used herein, the singular forms "a", "an" and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on", "engaged to", "connected to" or "coupled to" another element or layer, it may be directly on, engaged, connected or coupled to the other element or layer, or intervening elements or layers may be present. In contrast, when an element is referred to as being "directly on," "directly engaged to", "directly connected to" or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

The disclosure herein of particular values and particular ranges of values for given parameters are not exclusive of other values and ranges of values that may be useful in one or more of the examples disclosed herein. Moreover, it is envisioned that any two particular values for a specific parameter stated herein may define the endpoints of a range of values that may be suitable for the given parameter. The disclosure of a first value and a second value for a given parameter can be interpreted as disclosing that any value between the first and second values could also be employed for the given parameter. Similarly, it is envisioned that disclosure of two or more ranges of values for a parameter (whether such ranges are nested, overlapping or distinct) subsume all possible combination of ranges for the value that might be claimed using endpoints of the disclosed ranges.

The foregoing description of the embodiments has been provided for purposes of illustration and description. It is not intended to be exhaustive or to limit the invention. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the invention, and all such modifications are intended to be included within the scope of the invention.

What is claimed is:

1. A method for providing a conductive material structure on a carrier comprising:
   applying a photo sensitive material on the carrier;
   applying a mask on said photo sensitive material, the mask defining a conductive material structure to be formed on the carrier;
   irradiating the defined structure on the carrier in order to prepare for metallization;
   metalizing the defined structure for forming the conductive material structure;
   covering the formed conductive material structure with an environmental protection layer except for in a set of pre-specified areas, where said set of pre-specified areas includes at least one contact area on the conductive material structure; and
   placing electrical contact enhancing material on said contact area, which placing of electrical contact enhancing material is performed after the conductive material structure has been covered with the environmental protection layer;
   wherein:
      the carrier comprises a dielectric substrate;
      applying a photo sensitive material on the carrier comprises pad or screen printing said photo sensitive material directly on the dielectric substrate; and
      applying a mask on said photo sensitive material comprises selectively pad or screen printing said mask on said photo sensitive material.

2. The method according to claim 1, wherein irradiating involves UV light.

3. The method according to claim 1, wherein the photo sensitive material includes a polymer, which a reagent after irradiation binds to the carrier, said polymer having fiber strands on which metal will attach.

4. The method according to claim 1, further comprising removing residual material from the carrier after it has been irradiated.

5. The method according to claim 1, further comprising drying the mask and/or the photo sensitive layer before irradiating.

6. The method according to claim 1, wherein placing electrical contact enhancing material comprises plating electrical contact enhancing material onto said contact area while using the environmental protection layer as a mask.

7. The method according to claim 1, wherein covering the conductive material structure with an environmental protection layer comprises applying the environmental protection layer on a side of the conductive material structure that faces away from the carrier.

8. The method according to claim 1, wherein the conductive material structure defines at least one antenna radiator.

9. The method according to claim 1, wherein
   the dielectric substrate of the carrier and the conductive material structure have a three-dimensional extension.

10. The method according to claim 1, wherein the carrier is a mounting entity for being mounted in a piece of electronic equipment and the conductive material structure is provided on at least one exterior surface of said mounting entity.

11. The method according to claim 10, wherein said piece of electronic equipment is a portable electronic device.

12. The method according to claim 11, wherein the portable electronic device is a portable radio communication device.

13. The method according to claim 12, wherein the portable radio communication device is a cellular phone.

14. A method for providing a conductive material structure on a carrier comprising:
   applying a photo sensitive material on the carrier;
   applying a mask on said photo sensitive material, the mask defining a conductive material structure to be formed on the carrier;
   irradiating the defined structure on the carrier in order to prepare for metallization;
   metalizing the defined structure for forming the conductive material structure;
   covering the formed conductive material structure with an environmental protection layer except for in a set of pre-specified areas, where said set of pre-specified areas includes at least one contact area on the conductive material structure; and
   placing electrical contact enhancing material on said contact area, which placing of electrical contact enhancing material is performed after the conductive material structure has been covered with the environmental protection layer;
   wherein applying a mask comprises printing the mask, and wherein the printing is pad printing.

15. The method according to claim 14, wherein:
   the carrier comprises a dielectric substrate;
   applying a photo sensitive material on the carrier comprises pad or screen printing said photo sensitive material directly on the dielectric substrate; and
   applying a mask on said photo sensitive material comprises selectively pad or screen printing said mask on said photo sensitive material.

16. A method for providing a conductive material structure on a carrier comprising:
   applying a photo sensitive material on the carrier;
   applying a mask on said photo sensitive material, the mask defining a conductive material structure to be formed on the carrier;
   irradiating the defined structure on the carrier in order to prepare for metallization;
   metalizing the defined structure for forming the conductive material structure;
   wherein the carrier comprises a dielectric substrate;

wherein the dielectric substrate of the carrier and the conductive material structure have a three-dimensional extension; and wherein the conductive material structure is provided on a curved surface of the dielectric substrate of the carrier.

17. The method of claim 16, wherein:

applying a photo sensitive material on the carrier comprises pad or screen printing said photo sensitive material directly on the dielectric substrate of the carrier; and applying a mask on said photo sensitive material comprises selectively pad or screen printing the mask directly on said photo sensitive material.

18. A method for providing a conductive material structure on a carrier comprising:

applying a photo sensitive material on the carrier by printing said photo sensitive material on the carrier;

applying a mask on said photo sensitive material by printing said mask on said photo sensitive material, the mask defining a conductive material structure to be formed on the carrier;

irradiating the defined structure on the carrier in order to prepare for metallization; and metalizing the defined structure for forming the conductive material structure;

wherein the carrier and the conductive material structure extend in three dimensions;

wherein the carrier comprises a dielectric substrate; and wherein the conductive material structure is provided on a curved surface of the dielectric substrate of the carrier, or wherein the conductive material structure is provided on two planar surfaces of the dielectric substrate of the carrier that intersect at an acute, obtuse, or right angle to each other; and wherein:

printing said photo sensitive material on the carrier comprises pad printing said photo sensitive material directly on the dielectric substrate of the carrier; and printing said mask on said photo sensitive material comprises pad printing the mask directly on said photo sensitive material.

\* \* \* \* \*